US012777973B2

(12) United States Patent
Chen et al.

(10) Patent No.: US 12,777,973 B2
(45) Date of Patent: Oct. 27, 2026

(54) HIGH-BANDWIDTH PACKAGE-ON-PACKAGE STRUCTURE

(71) Applicant: MEDIATEK INC., Hsinchu City (TW)

(72) Inventors: Tai-Yu Chen, Hsinchu City (TW); Bo-Jiun Yang, Hsinchu City (TW); Tsung-Yu Pan, Hsinchu City (TW); Yin-Fa Chen, Hsinchu City (TW); Ta-Jen Yu, Hsinchu City (TW); Bo-Hao Ma, Hsinchu City (TW); Wen-Sung Hsu, Hsinchu City (TW); Yao-Pang Hsu, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 802 days.

(21) Appl. No.: 18/163,417

(22) Filed: Feb. 2, 2023

(65) Prior Publication Data

US 2023/0282626 A1 Sep. 7, 2023

Related U.S. Application Data

(60) Provisional application No. 63/315,127, filed on Mar. 1, 2022.

(51) Int. Cl.
*H10W 90/00* (2026.01)
*H10W 70/65* (2026.01)
(Continued)

(52) U.S. Cl.
CPC ........... *H10W 90/00* (2026.01); *H10W 70/65* (2026.01); *H10W 70/698* (2026.01);
(Continued)

(58) Field of Classification Search
CPC ... H10W 90/00; H10W 70/65; H10W 70/698; H10W 90/401; H10W 90/701;
(Continued)

(56) References Cited

U.S. PATENT DOCUMENTS 9,437,549 B2 9/2016 Ho et al.
10,475,765 B2 11/2019 Hsu et al.
(Continued)

FOREIGN PATENT DOCUMENTS

CN 110299329 A 10/2019
TW 201605000 A 2/2016
(Continued)

OTHER PUBLICATIONS

German language office action dated Apr. 22, 2025, issued in application No. DE 10 2023 104 120.7 (English language translation included on pp. 1-5 of attachment).
(Continued)

*Primary Examiner* — Theresa T Doan
(74) *Attorney, Agent, or Firm* — McClure, Qualey & Rodack, LLP

(57) ABSTRACT

A high-bandwidth package-on-package (HBPoP) structure includes a first package structure and a second package structure disposed over the first package structure. The first package structure includes a first package substrate, a semiconductor die, an interposer, and a molding material. The first package substrate is formed of a silicon and/or ceramic material. The semiconductor die is disposed over the first package substrate. The interposer is disposed over the semiconductor die and is formed of a silicon and/or ceramic material. The molding material is disposed between the first package substrate and the interposer and surrounds the semiconductor die.

20 Claims, 2 Drawing Sheets

(51) Int. Cl.

| | |
|---|---|
| ***H10W 70/698*** | (2026.01) |
| *H10W 70/60* | (2026.01) |
| *H10W 74/00* | (2026.01) |

(52) U.S. Cl.
CPC ....... *H10W 90/401* (2026.01); *H10W 90/701* (2026.01); *H10W 70/60* (2026.01); *H10W 74/00* (2026.01); *H10W 90/722* (2026.01); *H10W 90/724* (2026.01)

(58) Field of Classification Search
CPC ... H10W 70/60; H10W 74/00; H10W 90/722; H10W 90/724; H10W 70/611; H10W 70/635; H10W 90/288; H01L 25/105; H01L 23/147; H01L 23/49816; H01L 23/49833; H01L 23/49838; H01L 24/16; H01L 2224/16227; H01L 2225/1023; H01L 2225/1041; H01L 2225/1058; H01L 2924/1511; H01L 2924/152; H01L 2924/15311; H01L 2924/157; H01L 2924/15787; H01L 2924/182; H01L 2225/1094; H01L 23/5384
USPC .......................................................... 257/777
See application file for complete search history.

(56) References Cited

U.S. PATENT DOCUMENTS

| | | | | |
|---|---|---|---|---|
| 11,670,623 | B2 | 6/2023 | Kang et al. | |
| 2006/0012966 | A1* | 1/2006 | Chakravorty | H01L 23/642 257/E23.079 |
| 2011/0180930 | A1 | 7/2011 | Arai | |
| 2013/0285237 | A1 | 10/2013 | Yu | |
| 2016/0379967 | A1 | 12/2016 | Gamini | |
| 2017/0025342 | A1 | 1/2017 | Tseng | |
| 2019/0067205 | A1 | 2/2019 | Rae | |
| 2020/0395346 | A1 | 12/2020 | Jung | |
| 2021/0082782 | A1 | 3/2021 | Wang | |
| 2021/0320067 | A1 | 10/2021 | Kim | |
| 2022/0005793 | A1* | 1/2022 | Kang | H01L 25/50 |

FOREIGN PATENT DOCUMENTS

| | | | |
|---|---|---|---|
| TW | 201913944 | A | 4/2019 |
| TW | 201924010 | A | 6/2019 |
| TW | 202203396 | A | 1/2022 |
| WO | 2020237685 | A1 | 12/2020 |

OTHER PUBLICATIONS

Chinese language office action dated Dec. 4, 2023, issued in application No. TW 112107268.

* cited by examiner

HIGH-BANDWIDTH PACKAGE-ON-PACKAGE STRUCTURE

CROSS REFERENCE TO RELATED APPLICATIONS

This application claims the benefit of U.S. Provisional Application No. 63/315,127 filed on Mar. 1, 2022, the entirety of which is incorporated by reference herein.

BACKGROUND OF THE INVENTION

Field of the Invention

The present invention is related to semiconductor technology, and in particular to a semiconductor package structure.

Description of the Related Art

Semiconductor devices are widely used in various electronic applications, such as personal computers, mobile phones, digital cameras, and other electronic equipment. As a result of the progress being made in the semiconductor industry, a smaller semiconductor device that takes up less space than the previous generation of semiconductor devices is required. Consequently, Package-on-package (PoP) technology has become increasingly popular. The PoP technology vertically stacks two or more package structures, and thus the amount of area on the motherboard that it takes up can be reduced.

However, although existing semiconductor package structures generally meet requirements, they have not been satisfactory in every respect. For example, thermal dissipation is a critical problem that needs to be solved since it affects the performance of semiconductor package structures. Therefore, further improvements to semiconductor package structures are required.

BRIEF SUMMARY OF THE INVENTION

High-bandwidth package-on-package structures are provided. An exemplary embodiment of a high-bandwidth package-on-package (HBPoP) structure includes a first package structure and a second package structure disposed over the first package structure. The first package structure includes a first package substrate, a semiconductor die, an interposer, and a molding material. The first package substrate is formed of a silicon and/or ceramic material. The semiconductor die is disposed over the first package substrate. The interposer is disposed over the semiconductor die and is formed of a silicon and/or ceramic material. The molding material is disposed between the first package substrate and the interposer and surrounds the semiconductor die.

Another exemplary embodiment of a high-bandwidth package-on-package (HBPoP) structure includes a first package substrate, a semiconductor die, a molding material, and an interposer. The first package substrate includes a first wiring structure in a first ceramic layer. The semiconductor die is disposed over the first package substrate and is electrically coupled to the first wiring structure. The molding material surrounds the semiconductor die. The interposer is disposed over the molding material and includes a second wiring structure in a second ceramic layer.

Yet another exemplary embodiment of a high-bandwidth package-on-package (HBPoP) structure includes a first package structure and a second package structure stacked vertically. The first package structure includes a first silicon-based substrate, a semiconductor die, a second silicon-based substrate, and a molding material. The first silicon-based substrate includes a first wiring structure. The semiconductor die is disposed over the first silicon-based substrate and is electrically coupled to the first wiring structure. The second silicon-based substrate is disposed over the semiconductor die and includes a second wiring structure. The molding material is in contact with the first silicon-based layer and the second silicon-based layer and covers sidewalls of the semiconductor die.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
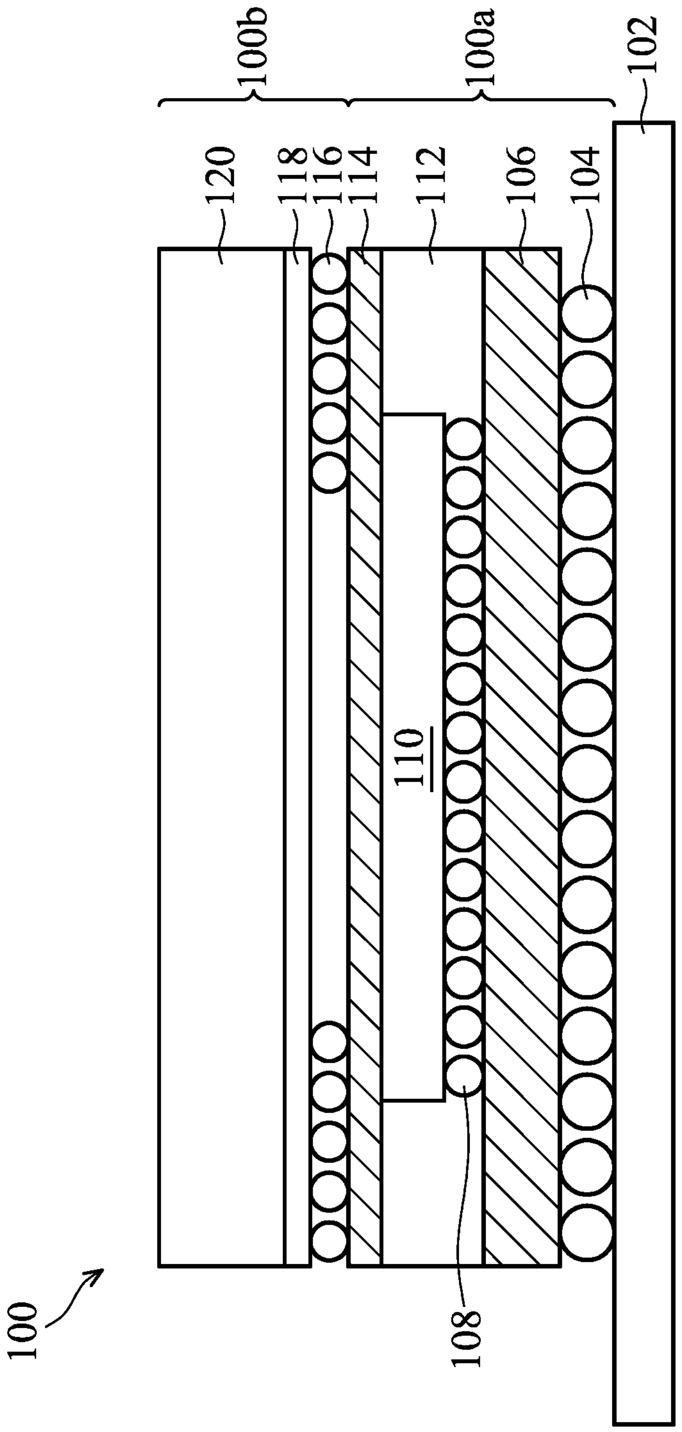
FIG. 1 is a cross-sectional view of an exemplary high-bandwidth package-on-package (HBPoP) structure in accordance with some embodiments.

The following description is made for the purpose of illustrating the general principles of the invention and should not be taken in a limiting sense. The scope of the invention is best determined by reference to the appended claims.

The present disclosure will be described with respect to particular embodiments and with reference to certain drawings, but the disclosure is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the disclosure.

Additional elements may be added on the basis of the embodiments described below. For example, the description of "forming a first element on/over a second element" may include embodiments in which the first element is in direct contact with the second element, and may also include embodiments in which additional elements are disposed between the first element and the second element such that the first element and the second element are not in direct contact.

The spatially relative descriptors of the first element and the second element may change as the structure is operated or used in different orientations. In addition, the present disclosure may repeat reference numerals and/or letters in the various embodiments. This repetition is for simplicity and clarity and does not in itself dictate a relationship between the various embodiments discussed.

A high-bandwidth package-on-package (HBPoP) structure is described in accordance with some embodiments of the present disclosure. The HBPoP structure is usually considered as a promising package candidate for high end smart phone System on a Chip (SoC), which has the advantage of high-bandwidth and short path of signal transmission. However, the heat up speed of the HBPoP structure is relatively quick due to the bad thermal conductivity and thermal diffusion of a substrate and an interposer in the HBPoP structure. In addition, the quick heat up speed will lead the performance worse and easily to hit the thermal throttling point.

In order to enhance thermal performance and slow down the heat up speed of the HBPoP structure, the HBPoP structure includes at least one substrate which is formed of good thermal diffusivity materials, including silicon, ceramic, the like, or a combination thereof, in accordance with some embodiments of the present disclosure. As a result, a better thermal diffusion capability can be achieved, thereby slowing down the heat up speed and extending the time of fully performance.

FIG. 1 is a cross-sectional view of a high-bandwidth package-on-package (HBPoP) structure 100 in accordance with some embodiments of the present disclosure. Additional features can be added to the HBPoP structure 100. Some of the features described below can be replaced or eliminated for different embodiments. To simplify the diagram, only a portion of the HBPoP structure 100 is illustrated.

As shown in FIG. 1, the HBPoP structure 100 includes a first package structure **100*a* and a second package structure 100*b* stacked vertically over a substrate 102, in accordance with some embodiments. The substrate 102 may be a printed circuit board (PCB) to provide mechanically support and may include conducting layers for electrically connecting electronic components. It should be noted that the configuration of the substrate 102 shown in the figures is exemplary only and is not intended to limit the present disclosure. Any desired semiconductor element may be formed in and on the substrate 102. However, in order to simplify the diagram, only the flat substrate 102** is illustrated.

The first package structure **100*a* includes a package substrate 106 which is electrically coupled to the substrate 102 through a plurality of conductive terminals 104, in accordance with some embodiments. The conductive terminals 104 may be formed of conductive materials, including copper, aluminum, tungsten, the like, an alloy thereof, or a combination thereof. In some embodiments, the conductive terminals 104** includes microbumps, controlled collapse chip connection (C4) bumps, solder balls, ball grid array (BGA) balls, the like, or a combination thereof.

Figure 2:
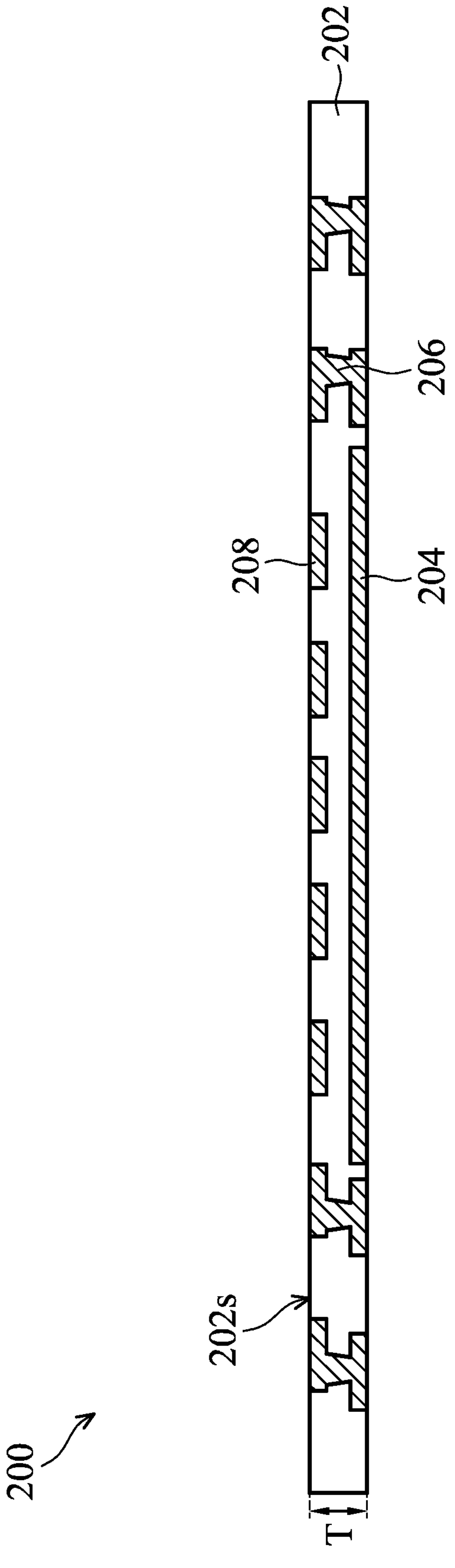
FIG. 2 is a cross-sectional view of a portion of the exemplary HBPoP structure of FIG. 1 in accordance with some embodiments.

The package substrate 106 will be described with reference to FIG. 2 as a substrate 200. FIG. 2 is a cross-sectional view of a portion of the HBPoP structure 100 of FIG. 1, in accordance with some embodiments. The substrate 200 may include a dielectric layer 202, which may be formed of good thermal diffusivity materials, including silicon, ceramic, the like, or a combination thereof. In the embodiments where the dielectric layer 202 is formed of silicon, the dielectric layer 202 may also be referred to as a silicon layer, and the substrate 200 may also be referred to as a silicon-based substrate. In the embodiments where the dielectric layer 202 is formed of ceramic, the dielectric layer 202 may also be referred to as a ceramic layer, and the substrate 200 may also be referred to as a ceramic-based substrate.

In some embodiments, the dielectric layer 202 may be formed of pure silicon or any suitable material. In some other embodiments, the dielectric layer 202 may be formed of a low-temperature co-fired ceramic (LTCC) material, a high-temperature co-fired ceramic (HTCC) material, the like, or a combination thereof.

Since the dielectric layer 202 may be formed of a silicon and/or ceramic material, it is unnecessary to include a solder mask for covering the surface **202*s* of the dielectric layer 202. As a result, the surface 202*s* of the dielectric layer 202** may be exposed.

Moreover, the thickness T of the substrate 200 can thus be reduced. For example, in the embodiments where the dielectric layer 202 is formed of silicon, the thickness T of the substrate 200 may be in a range between about 30 μm and about 250 μm, such as 40 μm. In the embodiments where the dielectric layer 202 is formed of ceramic, the thickness T of the substrate 200 may be in a range between about 30 μm and about 250 μm, such as 40 μm. The thickness T of the substrate 200 may be substantially equal to the thickness of the dielectric layer 202.

As shown in FIG. 2, the substrate 200 includes a wiring structure, in accordance with some embodiments. The wiring structure of the substrate 200 may include conductive layers 204, conductive vias 206, conductive pads 208, conductive pillars (not illustrated), the like, or a combination thereof. The wiring structure of the substrate 200 may be formed of metal, including copper, aluminum, tungsten, the like, an alloy thereof, or a combination thereof. Since the solder mask is omitted as described above, both of the top surface and the bottom surface of the substrate 200 may be planar. In other words, the outermost surfaces of the wiring structure (such as the top surfaces of the conductive pads 208) may be substantially coplanar with the surface **202*s* of the dielectric layer 202**.

It should be noted that the configuration of the substrate 200 shown in the figures is exemplary only and is not intended to limit the present disclosure. For example, the substrate 200 may include more than two conductive layers. Any desired semiconductor element may be formed in and on the substrate 200. However, in order to simplify the diagram, only the flat substrate 200 is illustrated.

Referring back to FIG. 1, the first package structure **100*a* includes a semiconductor die 110 disposed over a package substrate 106, in accordance with some embodiments. In some embodiments, the semiconductor die 110 includes a system-on-chip (SoC) die, a logic device, a memory device, a radio frequency (RF) device, the like, or any combination thereof. For example, the semiconductor die 110** may include a micro control unit (MCU) die, a microprocessor unit (MPU) die, a power management integrated circuit (PMIC) die, a radio frequency front end (RFFE) die, an accelerated processing unit (APU) die, a central processing unit (CPU) die, a graphics processing unit (GPU) die, an input-output (IO) die, a dynamic random access memory (DRAM) controller, a static random-access memory (SRAM), a high-bandwidth memory (HBM), an application processor (AP) die, the like, or any combination thereof.

According to some embodiments, the first package structure **100*a* may include more than one semiconductor dies disposed over a package substrate 106. Additionally, the first package structure 100*a* may also include one or more passive components (not illustrated) adjacent to the semiconductor die 110**, such as resistors, capacitors, inductors, the like, or a combination thereof.

As illustrated in FIG. 1, the first package structure **100*a* includes a plurality of conductive structures 108 disposed between the package substrate 106 and the semiconductor die 110 to electrically coupling the semiconductor die 110 to the wiring structure of the package substrate 106, in accordance with some embodiments. In some embodiments, the conductive structures 108 include microbumps, controlled collapse chip connection (C4) bumps, solder balls, ball grid array (BGA) balls, the like, or a combination thereof. The conductive structures 108** may be formed of conductive materials, including copper, aluminum, tungsten, titanium, tantalum, the like, an alloy thereof, or a combination thereof.

As illustrated in FIG. 1, the first package structure 100*a* includes a molding material 112 surrounding the semiconductor die 110 and the conductive structures 108, in accordance with some embodiments. The molding material 112 may include a nonconductive material, including a moldable polymer, an epoxy, a resin, the like, or a combination thereof. The molding material 112 may protect the semiconductor die 110 and the conductive structures 108 from the environment, thereby preventing these components from damage due to stress, chemicals, and moisture.

As shown in FIG. 1, the first package structure 100*a* includes an interposer 114 disposed over the molding material 112, in accordance with some embodiments. The sidewalls of the molding material 112 may be substantially coplanar with the sidewalls of the package substrate 106 and the sidewalls of the interposer 114.

For details of the interposer 114, refer to the substrate 200 in FIG. 2. Specifically, the interposer 114 may include a dielectric layer (such as the dielectric layer 202 in FIG. 2), which may be formed of silicon, ceramic, the like, or a combination thereof. In the embodiments where the dielectric layer of the interposer 114 is formed of silicon, the dielectric layer may also be referred to as a silicon layer, and the interposer 114 may also be referred to as a silicon-based substrate. Alternatively, in the embodiments where the dielectric layer of the interposer 114 is formed of ceramic, the dielectric layer may also be referred to as a ceramic layer, and the interposer 114 may also be referred to as a ceramic-based substrate.

In some embodiments, the dielectric layer of the interposer 114 may be formed of pure silicon or any suitable material. In some other embodiments, the dielectric layer of the interposer 114 may be formed of a low-temperature co-fired ceramic (LTCC) material, a high-temperature co-fired ceramic (HTCC) material, the like, or a combination thereof. The material of the interposer 114 may be similar to or different from the material of the package substrate 106.

Since the dielectric layer of the interposer 114 may be formed of a silicon and/or ceramic material, it is unnecessary to include a solder mask for covering the top surface and the bottom surface of the dielectric layer. As a result, the top surface of the dielectric layer of the interposer 114 may be exposed.

Moreover, the thickness of the interposer 114 can thus be reduced. For example, in the embodiments where the dielectric layer is formed of silicon, the thickness of the interposer 114 may be in a range between about 30 μm and about 250 μm, such as 40 μm. In the embodiments where the dielectric layer is formed of ceramic, the thickness of the interposer 114 may be in a range between about 30 μm and about 250 μm, such as 40 μm. The thickness of the interposer 114 may be greater than, less than, or substantially equal to the thickness of the package substrate 106.

In some embodiments, the interposer 114 includes a wiring structure (not illustrated). The wiring structure of the interposer 114 may be similar to the wiring structure of the substrate 200 in FIG. 2, and will not be repeated. Since the solder mask is omitted as described above, both of the top surface and the bottom surface of the interposer 114 may be planar. In other words, the outermost surfaces of the wiring structure of the interposer 114 may be substantially coplanar with the opposite surfaces of the dielectric layer of the interposer 114.

As shown in FIG. 1, the second package structure 100*b* is disposed over the first package structure 100*a* and is electrically coupled to the wiring structure in the interposer 114 through a plurality of conductive terminals 116, in accordance with some embodiments. The conductive terminals 116 may be similar to the conductive terminals 104, and will not be repeated.

As shown in FIG. 1, the second package structure 100*b* includes a package substrate 118, in accordance with some embodiments. The package substrate 118 may include a dielectric layer which is formed of organic materials, such as a polymer base material.

For details of the package substrate 118 in some other embodiments, refer to the substrate 200 in FIG. 2. In particular, the dielectric layer of the package substrate 118 may be formed of silicon, ceramic, the like, or a combination thereof. In the embodiments where the dielectric layer of the package substrate 118 is formed of silicon, the dielectric layer may also be referred to as a silicon layer, and the package substrate 118 may also be referred to as a silicon-based substrate. In the embodiments where the dielectric layer of the package substrate 118 is formed of ceramic, the dielectric layer may also be referred to as a ceramic layer, and the package substrate 118 may also be referred to as a ceramic-based substrate.

In some embodiments, the dielectric layer of the package substrate 118 may be formed of pure silicon or any suitable material. In some other embodiments, the dielectric layer of the package substrate 118 may be formed of a low-temperature co-fired ceramic (LTCC) material, a high-temperature co-fired ceramic (HTCC) material, the like, or a combination thereof. The material of the package substrate 118 may be similar to or different from the material of the package substrate 106 or the material of the interposer 114.

Since the dielectric layer of the package substrate 118 is formed of a silicon and/or ceramic material, it is unnecessary to include a solder mask for covering the top surface and the bottom surface of the dielectric layer. As a result, the bottom surface of the dielectric layer of the package substrate 118 may be exposed.

Moreover, the thickness of the package substrate 118 can thus be reduced. For example, in the embodiments where the dielectric layer is formed of silicon, the thickness of the package substrate 118 may be in a range between about 30 μm and about 250 μm, such as 40 μm. In the embodiments where the dielectric layer is formed of ceramic, the thickness of the package substrate 118 may be in a range between about 30 μm and about 250 such as 40 μm. The thickness of the package substrate 118 may be greater than, less than, or substantially equal to the thickness of the package substrate 106 or the thickness of the interposer 114.

In some embodiments, the package substrate 118 includes a wiring structure (not illustrated). The wiring structure of the package substrate 118 may be similar to the wiring structure of the substrate 200 in FIG. 2, and will not be repeated. Since the solder mask is omitted as described above, both of the top surface and the bottom surface of the package substrate 118 may be planar. In other words, the outermost surfaces of the wiring structure of the package substrate 118 may be substantially coplanar with the opposite surfaces of the dielectric layer of the package substrate 118.

As illustrated in FIG. 1, the second package structure 100*b* includes a molding material 120 disposed over the package substrate 118, in accordance with some embodiments. The molding material 120 may be similar to the molding material 112, and will not be repeated.

The second package structure 100*b* may include one or more semiconductor dies (not illustrated) surrounded by the molding material 120, in accordance with some embodiments. The semiconductor dies may include the same or different components. For example, the semiconductor dies may include memory dies, such as a dynamic random access memory (DRAM). In addition, the second package structure 100*b* may also include one or more passive components (not illustrated), such as resistors, capacitors, inductors, the like, or a combination thereof.

In summary, the HBPoP structure according to the present disclosure includes at least one substrate which is formed of silicon, ceramic, the like, or a combination thereof. As a result, a better thermal diffusion capability can be achieved, so that the heat up speed can be decelerated and the time of fully performance can be extended.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A high-bandwidth package-on-package (HBPoP) structure, comprising:
- a first package structure comprising:
- a first package substrate formed of a silicon and/or ceramic material;
- a semiconductor die disposed over the first package substrate;
- an interposer disposed over the semiconductor die and formed of a silicon and/or ceramic material; and
- a molding material disposed between the first package substrate and the interposer and surrounding the semiconductor die; and
- a second package structure disposed over the first package structure,
- wherein the entire top surface of the semiconductor die is in direct contact with the interposer.

2. The HBPOP structure as claimed in claim 1, wherein the first package substrate is formed of a low-temperature co-fired ceramic material, a high-temperature co-fired ceramic material, or a combination thereof.

3. The HBPOP structure as claimed in claim 1, wherein the interposer is formed of a low-temperature co-fired ceramic material, a high-temperature co-fired ceramic material, or a combination thereof.

4. The HBPOP structure as claimed in claim 1, wherein the first package substrate is formed of pure silicon.

5. The HBPOP structure as claimed in claim 4, wherein a thickness of the first package substrate is between about 30 μm and about 250 μm.

6. The HBPOP structure as claimed in claim 1, wherein the interposer is formed of pure silicon.

7. The HBPOP structure as claimed in claim 6, wherein a thickness of the interposer is between about 30 μm and about 250 μm.

8. The HBPOP structure as claimed in claim 1, wherein the second package structure comprises a second package substrate formed of a low-temperature co-fired ceramic material, a high-temperature co-fired ceramic material, or a combination thereof.

9. The HBPOP structure as claimed in claim 1, wherein the second package structure comprises a second package substrate formed of pure silicon.

10. The HBPOP structure as claimed in claim 9, wherein a thickness of the second package substrate is between about 30 μm and about 250 μm.

11. A high-bandwidth package-on-package (HBPoP) structure, comprising:
- a first package substrate comprising a first wiring structure in a first ceramic layer;
- a semiconductor die disposed over the first package substrate and electrically coupled to the first wiring structure;
- a molding material surrounding the semiconductor die; and
- an interposer disposed over the molding material and comprising a second wiring structure in a second ceramic layer,
- wherein the entire top surface of the semiconductor die is in direct contact with the interposer.

12. The HBPOP structure as claimed in claim 11, wherein the first ceramic layer and the second ceramic layer are each formed of a low-temperature co-fired ceramic material, a high-temperature co-fired ceramic material, or a combination thereof.

13. The HBPOP structure as claimed in claim 11, wherein a thickness of the first ceramic layer is between about 30 μm and about 250 μm.

14. The HBPOP structure as claimed in claim 11, wherein a thickness of the second ceramic layer is between about 30 μm and about 250 μm.

15. The HBPOP structure as claimed in claim 11, wherein a bottom surface of the first ceramic layer and a top surface of the second ceramic layer are exposed.

16. The HBPOP structure as claimed in claim 11, further comprising a second package substrate disposed over the interposer, wherein the second package substrate comprises a third wiring structure in a third ceramic layer, and the third ceramic layer is formed of a low-temperature co-fired ceramic material, a high-temperature co-fired ceramic material, or a combination thereof.

17. The HBPOP as claimed in claim 16, wherein a thickness of the third ceramic layer is between about 30 μm and about 250 μm.

18. A high-bandwidth package-on-package (HBPoP) structure, comprising:
- a first package structure and a second package structure stacked vertically, wherein the first package structure comprises:
- a first silicon-based substrate comprising a first wiring structure;
- a semiconductor die disposed over the first silicon-based substrate and electrically coupled to the first wiring structure;
- a second silicon-based substrate disposed over the semiconductor die and comprising a second wiring structure; and
- a molding material in contact with the first silicon-based substrate and the second silicon-based substrate and covering sidewalls of the semiconductor die,
- wherein the entire top surface of the semiconductor die is in direct contact with the second silicon-based substrate.

19. The HBPOP structure as claimed in claim 18, wherein the first silicon-based substrate and the second silicon-based substrate are formed of pure silicon.

20. The HBPOP structure as claimed in claim 18, wherein the second package structure comprises a third wiring structure in pure silicon.

* * * * *